(12) United States Patent
Broekaart et al.

(10) Patent No.: US 11,088,016 B2
(45) Date of Patent: Aug. 10, 2021

(54) METHOD FOR LOCATING DEVICES

(71) Applicant: Soitec, Crolles (FR)

(72) Inventors: Marcel Broekaart, Theys (FR); Ionut Radu, Crolles (FR); Chrystelle Lagahe Blanchard, Crolles (FR)

(73) Assignee: Soitec, Bernin (FR)

(*) Notice: Subject to any disclaimer, the term of this patent is extended or adjusted under 35 U.S.C. 154(b) by 0 days.

(21) Appl. No.: 16/685,938

(22) Filed: Nov. 15, 2019

(65) Prior Publication Data
US 2020/0161172 A1     May 21, 2020

Related U.S. Application Data

(63) Continuation of application No. 14/903,961, filed as application No. PCT/FR2014/051568 on Jun. 24, 2014, now abandoned.

(30) Foreign Application Priority Data

Jul. 15, 2013   (FR) ...................................... 1301697

(51) Int. Cl.
    *H01L 21/762*     (2006.01)
    *H01L 27/146*     (2006.01)
    *H01L 23/544*     (2006.01)

(52) U.S. Cl.
    CPC ...... *H01L 21/76254* (2013.01); *H01L 23/544* (2013.01); *H01L 27/14687* (2013.01);
(Continued)

(58) Field of Classification Search
    CPC ......... H01L 2924/00; H01L 2924/0002; H01L 2924/00014; H01L 23/544; H01L 2924/0665
See application file for complete search history.

(56) References Cited

U.S. PATENT DOCUMENTS 5,578,519 A     11/1996    Cho
8,058,137 B1 *   11/2011    Or-Bach .............. H03K 17/687
                                                                           257/E21.023

(Continued)

FOREIGN PATENT DOCUMENTS

JP         01-239921 A     9/1989
JP        2005-311307 A    11/2005

(Continued)

OTHER PUBLICATIONS

Korean Notification of Reasons for Refusal for Korean Application No. 10-2016-7001033, dated Mar. 30, 2020, 6 pages.

(Continued)

*Primary Examiner* — Tony Tran
(74) *Attorney, Agent, or Firm* — TraskBritt

(57) ABSTRACT

The disclosure relates to a process for locating devices, the process comprising the following steps:
   a) providing a carrier substrate comprising:
       a device layer; and
       alignment marks;
   b) providing a donor substrate;
   c) forming a weak zone in the donor substrate, the weak zone delimiting a useful layer;
   d) assembling the donor substrate and the carrier substrate; and
   e) fracturing the donor substrate in the weak zone so as to transfer the useful layer to the device layer;
   wherein the alignment marks are placed in cavities formed in the device layer, the cavities having an aperture flush with the free surface of the device layer.

20 Claims, 3 Drawing Sheets

(52) U.S. Cl.
CPC ............... *H01L 2223/54426* (2013.01); *H01L 2924/0002* (2013.01)

(56) References Cited

U.S. PATENT DOCUMENTS

| | | | |
|---|---|---|---|
| 2011/0156212 A1 | 6/2011 | Arena | |
| 2011/0298021 A1 | 12/2011 | Tada et al. | |
| 2013/0037958 A1* | 2/2013 | Ho | H01L 27/14687 257/773 |
| 2014/0342487 A1 | 11/2014 | Nicolas | |

FOREIGN PATENT DOCUMENTS

| | | |
|---|---|---|
| JP | 2010-098151 A | 4/2010 |
| JP | 2011-243968 A | 12/2011 |
| JP | 2012-501092 A | 1/2012 |
| JP | 2012-042653 | 3/2012 |
| KR | 10-0543393 B1 | 1/2006 |
| WO | 20101098151 A1 | 9/2010 |
| WO | 20121042653 A1 | 4/2012 |

OTHER PUBLICATIONS

Madou, Marc J., Fundamentals of Microfabrication: The Science of Miniaturization, 2nd edition, Nanogen, Inc., San Diego, CA.
French Search Report for French Application No. 1301697 dated Dec. 12, 2013, 2 pages.
International Search Report for International Application No. PCT/FR2014/051568 dated Oct. 6, 2014, 2 pages.
International Written Opinion for International Application No. PCT/FR2014/051568 dated Oct. 6, 2014, 4 pages.
InternationalPreliminary Report on Patentability for International Application No. PCT/FR2014/051568 dated Jan. 19, 2016, 5 pages.
Japanese Notice of Reasons for Refusal for Japanese Application No. 2016-526673, dated Feb. 26, 2018, 6 pages with English Translation.
Japanese Search Report for Japanese Application No. 2016-526673, dated Feb. 22, 2018, 31 pages with English Translation.
Japanese Written Opinion for Japanese Application No. 2016-526673, dated Jun. 1, 2018, 5 pages with English Translation.

* cited by examiner

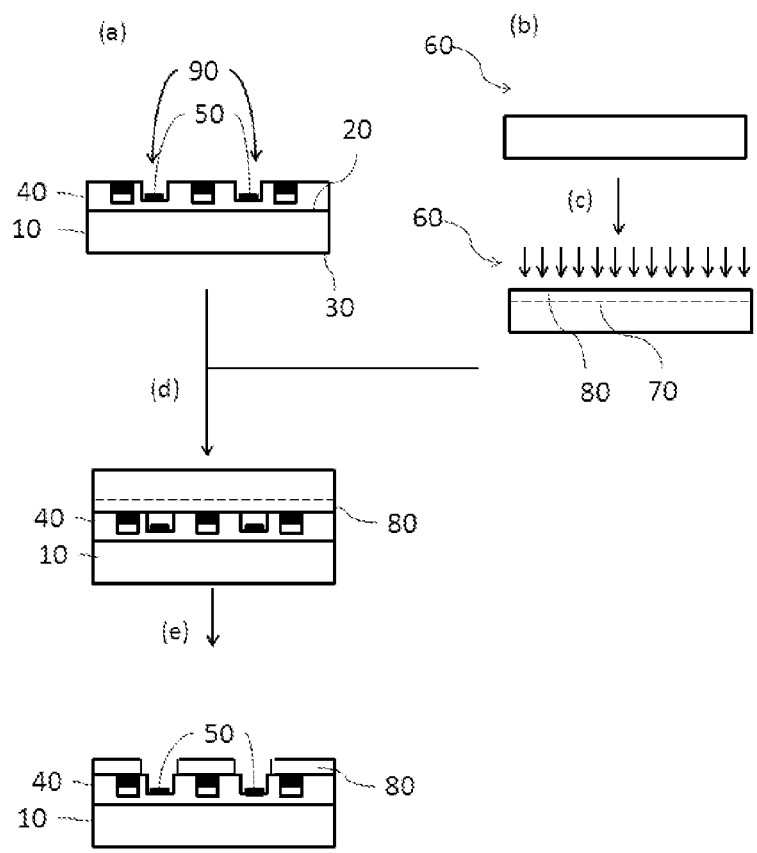
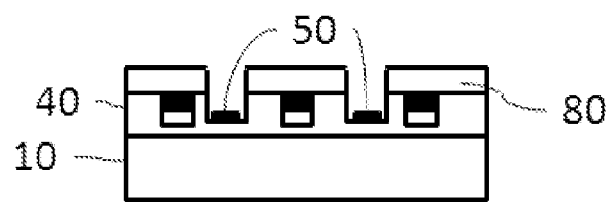
Fig 2
Fig 3

METHOD FOR LOCATING DEVICES

CROSS-REFERENCE TO RELATED APPLICATIONS

This application is a continuation of U.S. patent application Ser. No. 14/903,961, filed Jan. 8, 2016, which is a national phase entry under 35 U.S.C. § 371 of International Patent Application PCT/FR2014/051568, filed Jun. 24, 2014, designating the United States of America and published in English as International Patent Publication WO 2015/007971 A1 on Jan. 22, 2015, which claims the benefit under Article 8 of the Patent Cooperation Treaty and under 35 U.S.C. § 119(e) to French Patent Application Serial No. 1301697, filed Jul. 15, 2013, the disclosure of each of which is hereby incorporated herein in its entirety by this reference.

TECHNICAL FIELD

This disclosure relates to a process for locating devices after transfer of a useful layer to a carrier substrate.

BACKGROUND

A prior-art process for locating devices after transfer of a useful layer 8 to a carrier substrate 1, as illustrated in FIG. 1A, comprises the following steps:
- a0) Providing a carrier substrate 1 comprising:
  - A front side 2;
  - A back side 3 parallel to the front side 2; and
  - A device layer 4 placed on the front side 2, the device layer 4 comprising alignment marks 5;
- b0) Providing a donor substrate 6;
- c0) Forming a weak zone 7 in the donor substrate 6, the weak zone 7 delimiting a useful layer 8;
- d0) Assembling the donor substrate 6 and the carrier substrate 1; and
- e0) Fracturing the donor substrate 6 in the weak zone 7 so as to transfer the useful layer 8 to the device layer 4.

The device layer 4 comprises devices such as transistors, (npn or pnp) junctions, interconnections and any other structure. The useful layer 8 generally comprises an opaque semiconductor layer.

After the fracturing step e0), the useful layer 8 masks the devices of the device layer 4 and the alignment marks 5.

The main drawback of this process is that the alignment marks 5 are no longer accessible or observable.

Therefore, such as shown in FIG. 1B, which illustrates a common practice, apertures 9 (or holes) must be produced in the useful layer 8 in order to expose the alignment marks 5.

The process for forming the apertures 9 generally comprises a photolithography step, followed by an etching step.

The photolithography step is intended to define the shape and position of the apertures 9 in the useful layer 8. However, this step, carried out with no reference point other than the edge of the carrier substrate 1, has a precision of +/−100 µm. Therefore, the alignment marks 5 can be localized only to within +/−100 µm. The apertures 9 must thus have a side length (i.e., a width) of about 250 µm. Such a side length consumes too much space, and is unacceptable.

One aim of the disclosure is, therefore, to provide a simpler process for locating devices after transfer of a useful layer 8, allowing smaller apertures to be formed than with prior-art techniques.

BRIEF SUMMARY

This disclosure aims to remedy the aforementioned drawbacks, and relates to a process for locating devices after transfer of a useful layer, the process comprising the following steps:
- a) providing a carrier substrate comprising:
  - a device layer comprising a free surface; and
  - alignment marks;
- b) providing a donor substrate;
- c) forming a weak zone in the donor substrate, the weak zone delimiting a useful layer;
- d) assembling the donor substrate and the carrier substrate; and
- e) fracturing the donor substrate in the weak zone so as to transfer the useful layer to the device layer.

The alignment marks are placed in cavities formed in the device layer, the cavities having an aperture flush with the free surface of the device layer. The alignment marks are placed so as to make it possible to locate the devices.

The useful layer may be formed from a set of sublayers. The useful layer is generally opaque and, therefore, masks the device layer after step e).

The cavities have walls, and the volume delimited by the walls of a cavity and its aperture makes up the volume of the cavity.

By "alignment marks placed in cavities," is meant that the alignment marks are placed in the volume of the cavities.

The presence of through-holes in the useful layer has been observed after the fracturing step e), and in positional correspondence with the cavities. The holes thus extend through the cavities into the useful layer, so that the alignment marks are visible from the free surface of the useful layer.

Thus, the devices of the device layer may be located from the free surface of the useful layer.

Furthermore, it is not necessary to execute fabrication steps specific to the formation of holes in the useful layer. The holes are automatically formed in the positions of the cavities at the moment of the transfer of the useful layer.

According to one method of implementation, the assembly step d) comprises a direct bonding step executed in an environment at a pressure below 20 mbars.

Thus, it has been observed that the through-holes in the useful layer have a shape that corresponds to the aperture of the cavities. Therefore, the through-holes in the useful layer do not encroach beyond the aperture of the cavities.

According to one method of implementation, the cavities extend as far as into the carrier substrate.

According to one method of implementation, the alignment marks are placed at the bottom of the cavities.

According to one method of implementation, the device layer comprises devices regularly distributed over the entire extent of the device layer.

According to one method of implementation, an opaque layer is present on the useful layer before the assembly step d).

According to one method of implementation, the opaque layer comprises at least one material selected from the following group: tungsten, titanium, tungsten silicide, titanium silicide, nickel silicide, nickel silicide and platinum.

According to one method of implementation, step c) of forming the weak zone is executed by implanting at least one of the species selected from the following group: hydrogen and helium.

According to one method of implementation, the fracturing step e) comprises a heat treatment executed at a temperature between 200° C. and 500° C.

According to one method of implementation, the thickness of the useful layer is smaller than 8000 Å and preferably smaller than 5000 Å.

According to one method of implementation, the useful layer comprises sublayers of different doping.

BRIEF DESCRIPTION OF THE DRAWINGS

Other features and advantages will become apparent from the following description of methods of implementation of a process for locating devices according to the disclosure, which are given by way of nonlimiting example and with reference to the appended drawings, in which:

FIG. 2 is a schematic representation of a process for locating devices according to one embodiment of the disclosure;

FIG. 3 is a schematic representation of the structure obtained with the process for locating devices according to a second embodiment of the disclosure.

DETAILED DESCRIPTION

Figure 1A:
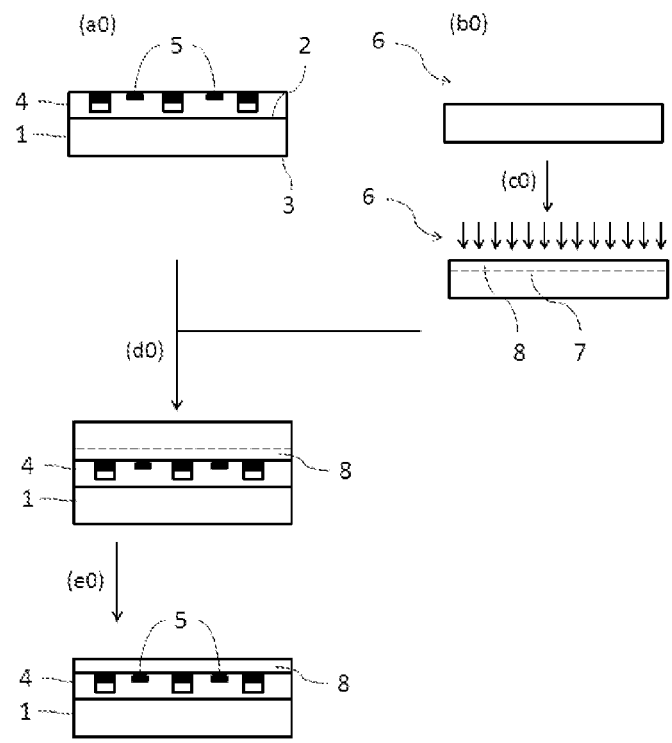
FIGS. 1A and 1B are schematic representations of a structure obtained with a process for locating devices according to prior-art techniques.
Figure 1B:
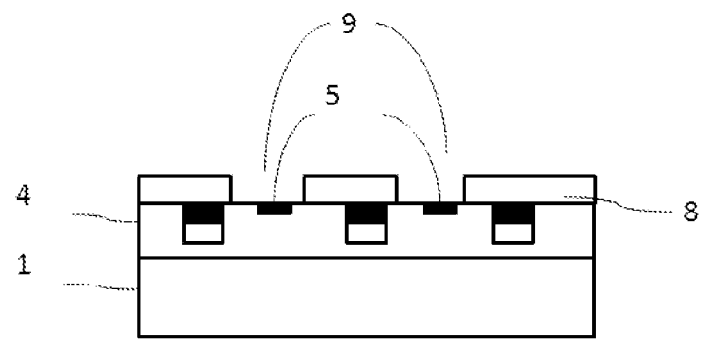

For the various methods of implementation, the same references will be used for elements that are identical or that provide the same function, for the sake of simplicity of the description.

FIGS. 2 and 3 schematically illustrate a process for locating devices.

To facilitate the illustration, the respective thicknesses of the various layers are not shown to scale.

Step a) of the process for locating devices comprises providing a carrier substrate 10 comprising a front side 20 and a back side 30 parallel to the front side 20.

The carrier substrate 10 may comprise a bulk substrate on which a device layer 40 is formed on the front side 20 of the carrier substrate 10.

The bulk substrate may consist of any material conventionally used in the microelectronics, optics, optoelectronics and photovoltaic industries.

In particular, the bulk substrate may comprise at least one material selected from the following group: silicon, silicon carbide, silicon germanium, glass, a ceramic and a metal alloy.

The device layer 40 comprises devices, such as electronic devices (for example transistors, junctions, etc.), interconnections and/or metalized zones.

The devices are formed using techniques well known to those skilled in the art.

The devices may be regularly distributed over the entire extent of the device layer 40.

Cavities 90 are formed in the device layer 40. The cavities 90 are open and comprise an aperture flush with the free surface of the device layer 40.

The cavities 90 comprise walls. The walls of the cavity 90 and the aperture of the cavity 90 delimit the volume of the cavity 90.

Advantageously, the cavities 90 may extend as far as into the carrier substrate 10.

Alignment marks 50 are placed in the volume of the cavities 90, and the alignment marks 50 are away from the aperture of the cavities 90.

The alignment marks 50 are placed so as to make it possible to precisely locate the devices of the device layer 40.

Alignment marks 50 are conventionally used to align photolithography masks.

The alignment marks 50 may take the form of crosses, chevrons or interference patterns, or any other form liable to allow the precise location of the devices to be determined.

In this respect, those skilled in the art will find a technical description of the alignment or photolithography masks in *Fundamentals of Microfabrication: The Science of Miniaturization*, $2^{nd}$ ed., Marc J. Madou, Nanogen, Inc., San Diego, Calif.

Advantageously, the alignment marks 50 are placed at the bottom of the cavities 90.

Step b) of the process for locating devices comprises providing a donor substrate 60.

The donor substrate 60 may be made of any material conventionally used in the microelectronics, optics, optoelectronics and photovoltaic industries.

In particular, the donor substrate 60 may comprise at least one material selected from the following group: silicon, silicon carbide and silicon germanium.

The donor substrate 60 may comprise a semiconductor material.

Step c) of the process for locating devices may comprise forming a weak zone 70 in the donor substrate 60.

The donor substrate 60 comprises a first surface. The weak zone 70 and the first surface of the donor substrate 60 delimit a useful layer 80 intended to be transferred to the device layer 40.

The weak zone 70 may be obtained by implanting atomic species. The weakening implantation may be carried out with a single species (for example, hydrogen or helium), but may also be carried out with a plurality of sequentially implanted species (for example, hydrogen and helium).

Advantageously, the hydrogen is implanted with an energy of between 20 and 70 keV, and a dose of between $4 \times 10^{16}$ and $6 \times 10^{16}$ atoms/cm$^2$.

The helium may be implanted with an energy of between 20 and 70 keV, and a dose of between $0.5 \times 10^{16}$ and $3 \times 10^{16}$ atoms/cm$^2$.

In some embodiments, the useful layer 80 may have a thickness smaller than 8000 Å and preferably smaller than 5000 Å.

Step d) of the process for locating devices may comprise assembling the donor substrate 60 and the carrier substrate 10.

In some embodiments, the assembly step d) may be executed by direct bonding.

The assembly may be executed by bringing the useful layer 80 into direct contact with the device layer 40. The assembly is executed so as to preserve, at least in part, the volume of the cavities 90. Therefore, the presence of cavities 90 generates unbonded zones.

The assembly step d) may comprise a direct bonding step executed in an environment at a pressure below 20 mbar (2000 Pa).

Figure 4:
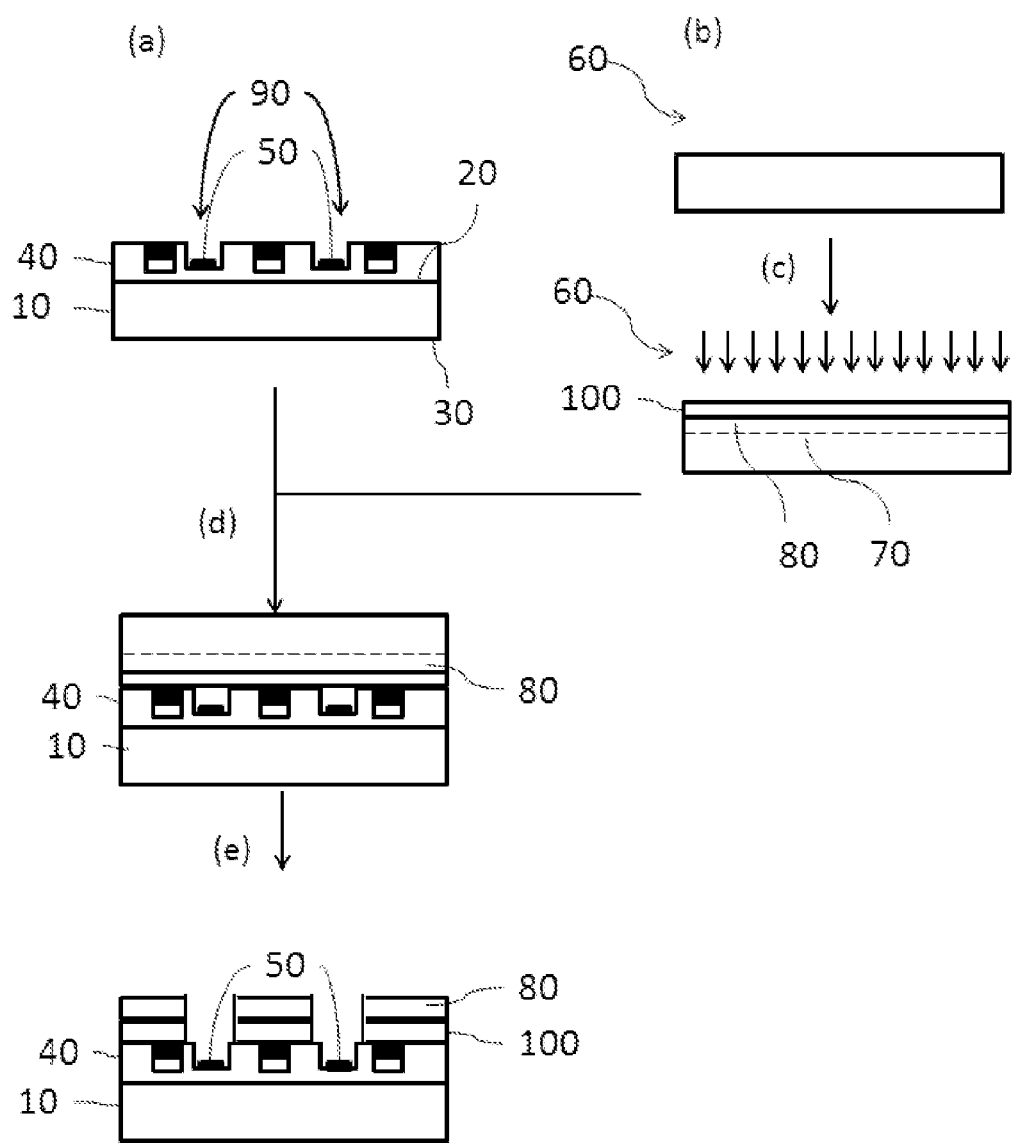
FIG. 4 is a schematic representation of the process for locating devices according to one embodiment of the disclosure.

Such as illustrated in FIG. 4, an intermediate layer 100 may be placed on the useful layer 80 before the assembly step d).

The intermediate layer 100 may be an opaque layer placed on the useful layer 80.

The opaque layer may comprise at least one material selected from the following group: tungsten, titanium, tungsten silicide, titanium silicide, nickel silicide, nickel silicide and platinum.

Step e) of the method for locating devices comprises fracturing the donor substrate 60 in the weak zone 70 so as to transfer the useful layer 80 to the device layer 40.

Thus, after step e), the useful layer 80 masks the devices.

If an opaque layer has been formed on the useful layer 80 prior to the assembly step d), the opaque layer is then located intermediate between the useful layer 80 and the device layer 40 after the fracturing step.

Advantageously, the fracturing step e) may comprise a heat treatment executed at a temperature between 200° C. and 500° C.

Particularly advantageously, after the fracturing step e), the presence of through-holes has been observed in the useful layer 80, and the opaque layer in the case where the latter is present.

Moreover, the through-holes in the useful layer 80 are in positional correspondence with the cavities 90, so that the through-holes extend the cavities 90 into the useful layer 80.

Furthermore, the aperture of each cavity 90 is inscribed in the aperture of a hole of the useful layer 80.

In embodiments in which step d) comprises direct bonding executed in an environment at a pressure below 20 mbar (2000 Pa), each through-hole in the useful layer 80 may have an aperture that corresponds to the aperture in the cavity 90 into which it extends, such as illustrated in FIG. 3.

The presence of these holes in the useful layer 80 is advantageously capitalized upon to expose the alignment marks 50 placed in the cavities 90.

Thus, it is possible to locate the devices masked by the useful layer 80.

What is claimed is:

1. A process for locating devices after transfer of a useful layer, the process comprising the following steps:
   a) providing a carrier substrate comprising:
      a device layer comprising a free surface and cavities having an aperture flush with the free surface; and
      alignment marks placed in the cavities of the device layer, away from the aperture;
   b) providing a donor substrate;
   c) forming a weak zone in the donor substrate, the weak zone delimiting a useful layer;
   d) assembling the donor substrate to the free surface of the device layer of the carrier substrate, the presence of the cavities in the device layer generating unbonded zones between the donor substrate and the carrier substrate; and
   e) fracturing the donor substrate in the weak zone so as to transfer the useful layer to the device layer, the useful layer and the cavities sized and configured such that through holes are automatically formed in the useful layer in positional correspondence with the cavities to expose the alignment marks upon the fracturing the donor substrate in the weak zone; and
   wherein the process does not include further fabrication steps specific to the formation of the through holes in the useful layer.

2. The process according to claim 1, in which the assembly step d) comprises a direct bonding step executed in an environment at a pressure below 20 mbars.

3. The process according to claim 2, wherein the cavities extend into the carrier substrate.

4. The process according to claim 3, wherein the alignment marks are placed at the bottom of the cavities.

5. The process according to claim 4, wherein the device layer comprises devices distributed over an entire extent of the device layer.

6. The process according to claim 4, wherein an opaque layer is present on the useful layer before the assembly step d).

7. The process according to claim 6, wherein the opaque layer comprises at least one material selected from the following group: tungsten, titanium, tungsten silicide, titanium silicide, nickel silicide, nickel silicide and platinum.

8. The process according to claim 4, wherein the step c) of forming the weak zone is executed by implanting at least one species selected from the following group: hydrogen and helium.

9. The process according to claim 4, wherein the fracturing step e) comprises a heat treatment executed at a temperature between 200° C. and 500° C.

10. The process according to claim 1, wherein the thickness of the useful layer is smaller than 8000 Å.

11. The process according to claim 1, wherein the useful layer comprises sublayers of different doping.

12. The process according to claim 10, wherein the thickness of the useful layer is smaller than 5000 Å.

13. The process according to claim 1, wherein the cavities extend into the carrier substrate.

14. The process according to claim 1, wherein the alignment marks are placed at the bottom of the cavities.

15. The process according to claim 1, wherein the device layer comprises devices distributed over an entire extent of the device layer.

16. The process according to claim 1, wherein an opaque layer is present on the useful layer before the assembly step d).

17. The process according to claim 1, wherein the step c) of forming the weak zone is executed by implanting at least one species selected from the following group: hydrogen and helium.

18. The process according to claim 1, wherein the fracturing step e) comprises a heat treatment executed at a temperature between 200° C. and 500° C.

19. The process according to claim 1, wherein the step d) of assembling the donor substrate to the free surface of the device layer is executed so as to preserve, at least in part, a volume of the cavities.

20. A method for locating devices after transfer of a useful layer, the method comprising the following steps:
   a) providing a carrier substrate comprising:
      a device layer comprising a free surface and cavities having an aperture flush with the free surface; and
      alignment marks placed in the cavities of the device layer, away from the aperture;
   b) providing a donor substrate;
   c) forming a weak zone in the donor substrate, the weak zone delimiting a useful layer;
   d) bonding the donor substrate to the free surface of the device layer of the carrier substrate, the presence of the cavities in the device layer generating unbonded zones between the donor substrate and the carrier substrate; and
   e) fracturing the donor substrate in the weak zone after bonding the donor substrate so as to separate the useful layer from the donor substrate, the useful layer and the cavities sized and configured such that the aperture of the cavities are automatically inscribed into holes in the useful layer exposing the alignment marks through the holes in the useful layer upon the fracturing the donor substrate in the weak zone; and wherein the method does not include further fabrication steps specific to formation of the holes in the useful layer.

* * * * *